(12) United States Patent
Kumura

(10) Patent No.: US 7,924,179 B2
(45) Date of Patent: Apr. 12, 2011

(54) VARIABLE-LENGTH CODE DETERMINING DEVICE AND VARIABLE-LENGTH CODE DECODING METHOD

(75) Inventor: Takahiro Kumura, Tokyo (JP)

(73) Assignee: NEC Corporation, Tokyo (JP)

( * ) Notice: Subject to any disclaimer, the term of this patent is extended or adjusted under 35 U.S.C. 154(b) by 300 days.

(21) Appl. No.: 12/225,422

(22) PCT Filed: Mar. 15, 2007

(86) PCT No.: PCT/JP2007/055221
§ 371 (c)(1),
(2), (4) Date: Sep. 22, 2008

(87) PCT Pub. No.: WO2007/108395
PCT Pub. Date: Sep. 27, 2007

(65) Prior Publication Data
US 2010/0225508 A1 Sep. 9, 2010

(30) Foreign Application Priority Data

Mar. 23, 2006 (JP) .................................. 2006-079978

(51) Int. Cl.
*H03M 7/40* (2006.01)
(52) U.S. Cl. ..................................... 341/67; 375/240.25
(58) Field of Classification Search .................... 341/67, 341/65, 51; 375/240.25, 240.23, 240.01; 382/233, 244, 245, 246, 247; 712/213, 224, 712/226, 204; 707/101
See application file for complete search history.

(56) References Cited

U.S. PATENT DOCUMENTS
5,604,499 A 2/1997 Miyagoshi et al.
6,246,347 B1 6/2001 Bakhmutsky
6,934,338 B1 * 8/2005 Bublil et al. ............. 375/240.23

FOREIGN PATENT DOCUMENTS
JP 07-235878 9/1995
JP 2000-307433 A 11/2000
JP 2001-508993 A 7/2001
JP 2002-516501 A 6/2002
JP 2005-101731 A 4/2005

OTHER PUBLICATIONS

Cheng-Te Hseih et al., "A Concurrent Memory-Efficient VLC Decoder for MPEG Applications," IEEE Transactions on Consumer Electronics, vol. 42: Aug. 3, 1996, pp. 439-446.
Bai-Jue Shieh et al., "A New Approach of Group-Based VLC Codec System with Full Table Programmability," IEEE Transactions on Circuits and Systems for Video Technology, vol. 11: Feb. 2, 2001, pp. 210-221.

* cited by examiner

*Primary Examiner* — Joseph Lauture
(74) *Attorney, Agent, or Firm* — Foley & Lardner LLP

(57) ABSTRACT

To provide a decoding device that compactly stores prefix related information therein compatible to variable-length codes used in various systems. The decoding device includes a register file in which a prefix common portion and a word length of the prefix common portion, prefix individual portions and word lengths of the prefix individual portions, word lengths of suffixes, and an input bit sequence are stored, a bit matching unit that determines a prefix included in the input bit sequence from prefixes generated from the prefix common portion and the prefix individual portions, a codeword computation unit that computes the word length of a codeword included in the input bit sequence using the respective word lengths of the prefix common portion, a prefix individual portion, and a suffix corresponding to the determined prefix, and an index computation unit that computes an index in a symbol table using the respective word lengths of the corresponding suffix and the codeword.

7 Claims, 6 Drawing Sheets

FIG.3

REGISTER FILE 101

| Xs | 63 | plen[7] 0 | 59 | plen[6] 0 | 55 | plen[5] 0 | 51 | plen[4] 5 | 47 | plen[3] 5 | 43 | plen[2] 3 | 39 | plen[1] 2 | 35 | plen[0] 1 | 31 | slen[7] 0 | 27 | slen[6] 0 | 23 | slen[5] 0 | 19 | slen[4] 1 | 15 | slen[3] 0 | 11 | slen[2] 1 | 7 | slen[1] 1 | 3 | slen[0] 0 | 0 |

| Xp | 63 | prefix_part[7] 0b xxxx xxxx | 55 | prefix_part[6] 0b xxxx xxxx | 47 | prefix_part[5] 0b xxxx xxxx | 39 | prefix_part[4] 0b 0001 0xxx | 31 | prefix_part[3] 0b 0001 1xxx | 23 | prefix_part[2] 0b 001x xxxx | 15 | prefix_part[1] 0b 01xx xxxx | 7 | prefix_part[0] 0b 0xxx xxxx | 0 |

| Xc | 63 | prefix_common 0b 0101 xxxx xxxx xxxx xxxx xxxx | 31 | | 7 | clen 4 | 0 |

| Xd | 63 | symbol_index | 31 | | 7 | codeword_length | 0 |

| Xi | 63 | input_bits | 31 | | 0 |

VARIABLE-LENGTH CODE DETERMINING DEVICE AND VARIABLE-LENGTH CODE DECODING METHOD

This application is the National Phase of PCT/JP2007/055221, filed Mar. 15, 2007, which claims priority to Japanese Application No. 2006-079978, filed Mar. 23, 2006, the disclosures of which are hereby incorporated by reference in their entirety.

TECHNICAL FIELD

The present invention relates to a decoding technique for a compression encoded signal. More specifically, the invention relates to a decoding device and a decoding method of variable-length code (VLC).

BACKGROUND ART

Variable-length encoding is widely employed so as to compress an image and music. The variable-length encoding is an encoding method of assigning a shorter codeword to a symbol with a higher probability. The variable-length encoding has a feature that an average word length of codewords can be reduced. A method of decoding information encoded by such variable-length encoding can be classified into the following four methods: (a) a simple table lookup method; (b) a leading sign count method; (c) a binary tree method; and (d) a prefix grouping method. Though these designations are not common designations for decoding methods, these designations are herein used. These methods are briefly described below.

The (a) simple table lookup method is the simplest method. Suppose that the word length of a longest codeword is N bits. Then, the N bits are extracted from the head of an input bit sequence. Then, using those N bits as an index, an element is extracted from a table including $2^N$ elements. The element extracted from the table is a symbol corresponding to the codeword. This method has a disadvantage that the size of the table is large.

In the (b) leading sign count method, the group of a codeword is decoded, based on the number of contiguous sign bits (1s or 0s) at the head of an input bit sequence. M bits that follow the sign bits at the head of the input bit sequence are extracted, and using the M bits, the codeword is decoded. A number M is usually four, five, or the like, and changes according to the structure of codewords. However, there are some useless data in a table for decoding a codeword using the M bits. The size of the table in the (b) leading sign count method is smaller than that in the (a) simple table lookup method. However, according to the structure of codewords, two kinds of tables (for code lengths and symbols) sometimes become necessary. Most software variable-length decoders employ this method.

The (c) binary tree method is a decoding method in which a binary tree indicating a codeword is traced for every bit. When a leaf of the tree is arrived at, a symbol is decoded by referring to a table or the like. Though this method has a disadvantage that a throughput (of one bit per cycle) in this method is lower than that in other decoding method, this method is suitable for dedicated hardware implementation.

The (d) prefix grouping method is a decoding method based on a fact that "a codeword is divided into a prefix and a suffix". An input bit sequence is compared with prefixes of all codewords, and examines which prefix the input bit sequence has. Since the prefix and a code length of a codeword correspond in a one-to-one relationship, the code length can also be automatically known when the prefix can be identified. When the prefix of the input bit sequence is determined, the suffix is extracted from the input bit sequence. When the prefix and the suffix could be identified, an offset for referring to a table can be obtained. Then, using the offset, the table is searched and a symbol corresponding to the codeword is extracted. This prefix grouping method is described in Patent Documents 1 and 2, and Non-patent Documents 1 and 2.

The size of the table in the prefix grouping method is smaller than that in the (b) leading sign count method. The table size in the prefix grouping method is substantially equivalent to the number of symbols. Generally, it is difficult to execute processing of comparing the input bit sequence with the prefixes and processing of computing the offset from the prefix and the suffix, by software. Accordingly, this method is suitable for dedicated hardware implementation.

Patent Document 1: JP Patent Kokai Publication No. JP-A-07-235878

Patent Document 2: JP Patent Kohyo Publication No. JP-P-2002-516501A

Non-patent Document 1: Bai-Jue Shieh et al., "A New Approach of Group-Based VLC codec System with Full Table Programmability," IEEE Transactions on Circuits and Systems for Video Technology, Vol. 11, No. 2, February 2001.

Non-patent Document 2: Cheng-Teh Hsieh et al., "A Concurrent Memory-efficient VLC Decoder for MPEG Applications," IEEE Transactions on Consumer Electronics, Vol. 42, August 1996.

All descriptions of the Patent Documents and the Non-patent Documents described above are regarded as being incorporated herein by reference and described.

DISCLOSURE OF THE INVENTION

Problems to be Solved by the Invention

Analyses on the related arts by the present invention will be shown below.

In addition to the table that stores symbols therein, the prefix grouping method described above requires a table for storing (1) prefixes, (2) word lengths of codewords including the prefixes, and (3) word lengths of suffixes corresponding to the prefixes. Accordingly, while the prefix grouping method has a feature that the size of the table that stores the symbols therein is extremely small, the prefix grouping method has a problem that when the number of types of the prefixes is large, the size of the table that stores the above-mentioned items (1), (2), and (3) increases.

Further, the prefix grouping method has also a problem of not being able to be applied to various systems because the prefix grouping method is generally implemented as a dedicated hardware. Since the structure of variable-length code differs according to the encoding method, it is generally difficult to design an efficient, versatile variable-length decoder that may be used in various systems. A variable length decoder disclosed in Patent Document 2, for example, is an efficient decoder that uses a small amount of memory, which uses the prefix grouping method. The variable-length decoder, however, greatly depends on an MPEG-2 encoding method. Accordingly, it may be possible to apply the principle of this decoder to other encoding method, but it is necessary to design a new decoder.

Then, it is an object of the present invention to provide variable-length code decoding device and variable-length code decoding method for compactly storing information on a prefix.

It is other object of the present invention to provide variable-length code decoding method and variable-length code decoding device capable of accommodating to variable-length codes used in various systems.

Still other objects of the invention will be apparent from the entire disclosed contents of the description and claims.

Means to Solve the Problems

According to a first aspect of the present invention, a decoding device that decodes variable-length encoded codeword using a prefix included in the codeword comprises:

a storage unit that stores a prefix common portion common to a plurality of prefixes used for decoding, a prefix individual (i.e. remainder) portion except the prefix common portion in each prefix, and an input bit sequence including an unknown codeword of variable-length code; and a prefix identification unit that determines which prefix among a plurality of prefixes is included or not in the input bit sequence stored in the storage unit, the plurality of prefixes being generated from each prefix common portion and a plurality of prefix individual portions corresponding to the prefix common portion concerned, the prefix common portion and the prefix individual portions being stored in the storage unit.

According to a second aspect of the present invention, a decoding device that decodes variable-length encoded codeword using a decoded value table comprises:

storage means for storing a plurality of codewords used for decoding and word lengths of the codewords, and an input bit sequence including an unknown codeword of variable-length code;

identification means for determining which codeword among the codewords is included or not in the input bit sequence, using the codewords and the word lengths of the codewords;

word length computation means for computing word length of the unknown codeword included in the input bit sequence, based on a result of the determination;

index computation means for computing index for referring to the decoded value table, based on the result of the determination; and control means for controlling the identification means, the word length computation means, and the index computation means such that the word length of the unknown codeword included in the input bit sequence and the index are generated.

According to a third aspect of the present invention, there is provided variable-length code decoding method of decoding variable-length encoded codeword using a prefix included in the codeword. This decoding method includes the steps of:

storing in storage means a prefix common portion common to a plurality of prefixes used for decoding;

storing prefix common portion common to a plurality of prefixes used for decoding;

storing a prefix individual portion except the prefix common portion in each prefix;

storing an input bit sequence including an unknown codeword of variable-length code;

generating prefixes from each prefix common portion and a plurality of prefix individual portions corresponding to the prefix common portion concerned, the prefix common portion and the prefix individual portions being stored; and determining which prefix among the prefixes is included or not in the input bit sequence.

According to a fourth aspect of the present invention, there are provided programs for operating the decoding devices according to the first and second aspects and a program (product) that instructs a computer to execute the decoding method according to the third aspect. The programs include processing steps of executing respective steps of the decoding method according to the third aspect, or operate respective means of the decoding device according to the second aspect.

According to an exemplary embodiment of the present invention, a decoding device that decodes variable-length encoded codeword using a prefix included in the codeword comprises:

a storage unit that stores a prefix common portion common to a plurality of prefixes used for decoding and a word length of the prefix common portion, a prefix individual portion except the prefix common portion in each prefix and a word length of the prefix individual portion, a word length of a suffix except the prefix in each of a plurality of codewords, and an input bit sequence including an unknown codeword of variable-length code;

a prefix identification unit that determines which prefix among the prefixes generated from the prefix common portion and the plurality of prefix individual portions is included or not in the input bit sequence;

a word length computation unit that computes word length of the unknown codeword included in the input bit sequence, using the word length of the prefix common portion, the word length of the prefix individual portion, and the word length of the suffix, specified based on a result of the determination;

an index computation unit that computes index of a decoding table, using the word length of the suffix and the word length of the unknown codeword, specified based on the result of the determination; and a control unit that controls the prefix identification unit, the word length computation unit, and the index computation means, according to an instruction for generating the word length of the unknown codeword included in the input bit sequence and the index for the decoding table.

The decoding device may be implemented on a program control processor. In this case, the storage unit (means) is a register file. Then, the control unit (means) is an instruction decoder that controls the prefix identification unit means, the word length computation means, and the index computation unit [[(]]means[[)]] according to an instruction of a decoding program and stores in the register file the computed word length of the unknown codeword and the index for the decoding table.

The variable-length code decoding device according to the exemplary embodiment may be a processor (indicated by reference numeral 100 in FIG. 2) that may operate as a variable-length code decoder that decodes a variable length code using a prefix included in variable-length encoded codeword, and may be configured as follows.

At the register file (indicated by reference numeral 101 in FIG. 2), storage regions or registers are provided. The storage regions or registers are provided which are ones for storing bit sequence (common portion) common to a plurality of prefixes, word length of the common portion, bit sequence (individual portion, i.e. remainder portion) in each prefix except the common portion, word length of the individual portion, word length of a bit sequence (suffix) of a codeword except the prefix, input bit sequence including variable-length codeword, index for a decoding table that stores therein a symbol corresponding to the codeword, and word length of the codeword that has been decoded. Then, the prefix common portion, the word length of the prefix common portion, the prefix individual portion, the word length of the prefix individual portion, the word length of the suffix, and the input bit sequence including the codeword of the variable length-code are stored in the storage regions or the registers, respectively.

The prefix identification means (a bit matching unit 102 in FIG. 2) determines which prefix, among a plurality of prefixes generated from the prefix common portion and the prefix individual portions, is included or not in the input bit sequence. The word length computation means (a codeword length computation unit 103 in FIG. 2) computes a word length of the unknown codeword included in the input bit sequence, using the word length of the prefix common portion, the word length of the prefix individual portion, and the word length of the suffix, specified based on a result of the determination. The index computation means (an index computation unit 104 in FIG. 2) computes an index of the decoding table, using the word length of the suffix and the word length of the unknown codeword, specified based on the result of the determination.

Further, the control means (an instruction decoder 105 and a program memory 109 in FIG. 2) causes the identification means, index computation means, and word length computation means to operate, in response to the instruction given to the processor and stores in the register file the index computed by the index computation means and the word length of the codeword computed by the word length computation means.

Meritorious Effects of the Invention (1) A first effect of the present invention is that the size of a storage region where prefixes are stored can be reduced.

Conventionally, N prefixes have been stored in storage means such as a memory or a register, as they are. The length of a prefix varies from one bit to several tens of bits, and the number N of the prefixes varies from less than ten to approximately 30. The number of prefixes included in variable-length code used for intra AC coefficient encoding in an MPEG-2 video encoding system, for example, is 23, and a prefix word length varies from two bits to 12 bits. Prefix types and the prefix word length more or less change according to a manner in which the prefix is segmented. Thus, if a 16-bit width register be used, again because, conventionally, prefixes have been stored without any changes, registers corresponding to 23×2=46 bytes become necessary to store 23 prefixes.

On contrast therewith, according to the present invention, a prefix is divided into a common portion and individual portions, and the common portion and the individual portions are stored. Accordingly, in the case of 23 prefixes, for example, the 23 prefixes are divided into three groups composed of eight, eight, and seven prefixes, respectively. Then, three common portions and individual portions corresponding to the 23 prefixes are stored for the three groups. In this case, the common portions and the individual portions can be stored in eight-bit registers, respectively. Thus, the registers corresponding to a sum of 3+23=26 bytes become necessary. Conventionally, the registers corresponding to the 46 bytes have been necessary. Accordingly, the size of the registers that store the prefixes therein is halved according to the present invention.

Let's consider a variable-length code for a scalefactor for an MPEG-2 AAC (advanced audio coding) music encoding system as other example. The number of prefixes included in the variable-length code for the scalefactor is 37. A prefix word length varies from two bits to bits. If 24-bit width registers be employed, the registers corresponding to 37×3=111 bytes have been conventionally necessary to store the 37 prefixes.

On contrast therewith, according to the present invention, the 37 prefixes are divided into five groups composed of eight, eight, eight, eight, and five prefixes, respectively. Then, five common portions and individual portions corresponding to the 37 prefixes are stored. When the common portions are stored in 16-bit registers and the individual portions are stored in 8-bit registers, respectively, the registers corresponding to 5×2+37=47 bytes are necessary. In this example as well, according to the present invention, the prefixes can be stored with an approximately half capacity of that in a conventional art.

(2) A second effect of the present invention is that variable-length codes used in various encoding systems can be decoded at high speed. That is, the identification means, index computation means, and word length computation means can be operated, and word lengths of the index and the unknown codeword can be computed, in response to an instruction given to the processor. Then, even if the number of the prefixes is increased, by dividing those prefixes into a plurality of groups and repeating similar processing, the decoding device and the decoding method according to the present invention can be flexibly accommodated to the various encoding systems. Further, because the size of data to be loaded into the register file in the processor is smaller than in the conventional art, high-speed decoding processing becomes possible.

BRIEF DESCRIPTION OF THE DRAWINGS

FIG. 3 is a schematic diagram showing a state where prefix related information and an input bit sequence are stored in a register file 101 used in the decoding device in FIG. 2;

Figure 1A:
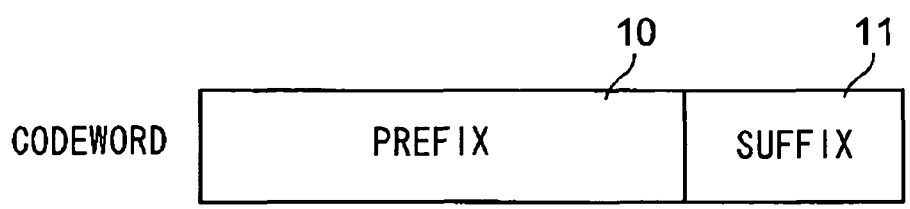
FIG. 1A is a schematic diagram of a codeword which is divided into a prefix and a suffix.

EXPLANATIONS OF SYMBOLS 100 processor
101 register file
102 bit matching unit
103 codeword length computation unit
104 index computation unit
105 instruction decoder
106 input/output unit
107 symbol table
108 decoded value memory
109 program memory

PREFERRED MODES FOR CARRYING OUT THE INVENTION

Figure 1B:
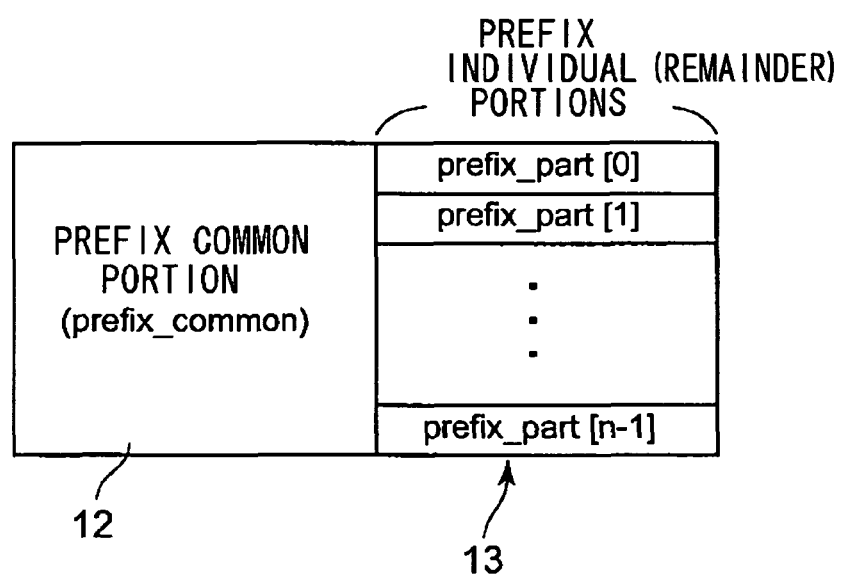
FIG. 1B is a schematic diagram showing a prefix common portion and prefix individual portions used in variable-length code decoding method according to the present invention.

FIG. 1A is a schematic diagram of a codeword which is divided into a prefix and a suffix. FIG. 1B is a schematic diagram showing a prefix common portion and prefix individual portions used in variable-length code decoding method according to the present invention.

As shown in FIG. 1A, the codeword is divided into a prefix 10 and a suffix 11. In other words, a bit sequence obtained by removing the prefix 10 from the codeword is the suffix 11.

Then, with respect to the prefix 10, a bit sequence common to a plurality of the prefixes 10 is denoted as a common portion 12, while a bit sequence obtained by removing the common portion 12 from the prefix 10 is denoted as an individual portion 13. FIG. 1B shows one common portion prefix_common and n prefix individual portions prefix_part[0] to prefix_part[n−1].

Using the common portion 12 and one arbitrary individual portion 13, an arbitrary prefix among n prefixes can be formed. When the prefix_common and a prefix_part [i] are coupled, for example, an i-th prefix can be obtained.

Variable-length codes have a property that the number of the codewords including similar bit sequences at heads thereof increases as word lengths of the codewords get longer. This is a general property of the variable-length codes. The present invention uses this property to divide the prefix into the common portion 12 and the individual portion 13, thereby reducing a storage capacity for the prefixes.

The prefixes may be divided into two or more groups, and the common portion 12 and the individual portions 13 described above may be created for each prefix in each group. When the number of the prefixes is N and the number of the groups is M, M common portions 12 and N individual portions 13 are obtained for N prefixes. When the prefixes are divided into a plurality of groups as described above, the storage capacity for the prefixes can be reduced as well.

Hereinafter, for simplicity of description, it is assumed that there are eight codewords shown in Table 1 and decoded values (symbols) respectively corresponding to the eight codewords are present, as an example.

TABLE 1

Correspondence Table between Codewords and Decoded Values

| codeword | word length | decoded value of codeword (symbol) |
|---|---|---|
| 0101 0 | 5 | 15 |
| 0101 010 | 7 | 8 |
| 0101 011 | 7 | 3 |
| 0101 0010 | 8 | 2 |
| 0101 0011 | 8 | 14 |
| 0101 0001 1 | 9 | 5 |
| 0101 0001 00 | 10 | 6 |
| 0101 0001 01 | 10 | 9 |

Using the example in Table 1, the relationship between a codeword and a prefix will be described first. Then, a brief description will be given to how the codeword can be decoded using the prefix.

1. Relationship Between Codeword and Prefix

The eight codewords shown in Table 1 are classified into five prefixes as shown in Table 2.

TABLE 2

Correspondence Table between Codewords and Prefixes

| codeword | prefix | prefix length [bits] | suffix length [bits] |
|---|---|---|---|
| 0101 0 | 0101 0 | 5 | 0 |
| 0101 010 | 0101 01 | 6 | 1 |
| 0101 011 | | | |
| 0101 0010 | 0101 001 | 7 | 1 |
| 0101 0011 | | | |
| 0101 0001 1 | 0101 0001 1 | 9 | 0 |
| 0101 0001 00 | 0101 0001 0 | 9 | 1 |
| 0101 0001 01 | | | |

A method comprising the following steps a) to d) can be used, in order to obtain Table 2 from Table 1:

a) dividing codewords into groups, each group being composed of codewords having the same word length;

b) arranging the codewords in the form of binary numbers in ascending order in each codeword group;

c) when a binary difference between all combinations of two adjacent codewords in each codeword group is not "1", processing of allocating those codewords into different codeword groups is performed. Each codeword group is further divided into some groups by this processing.

d) defining a bit sequence common to the codewords belonging to each codeword group as a prefix. With these steps, a prefix is determined for each codeword group.

As seen from Table 2, the codewords belonging to the same codeword group have the same word length and the same prefix.

2. Decoding of Codeword Using Prefix

As described above, there is a one-to-one relationship between the prefix and the word length of the codeword. Using this relationship, an unknown codeword can be identified. That is, at first, the prefix of the unknown codeword is searched, and the word length of the unknown codeword is determined from the prefix. Then, the prefix is removed from the unknown codeword, and the suffix is thereby extracted. Using the suffix, the unknown codeword can be identified.

Further, the prefix has a property that even if the number of codewords increases, the number of prefixes does not increase so much. Accordingly, the number of times of matching between the prefixes and the unknown codeword is smaller than the number of times of matching between the unknown codeword and all the codewords. Thus, higher-speed matching thereby becomes possible.

Further, since the unknown codeword is identified using the prefix, the size of a symbol table that stores therein decoded values (symbols) corresponding to the codewords may be extremely reduced. It is because, since the unknown codeword is identified when the symbol corresponding to the unknown codeword is extracted from the symbol table, it is enough to store one symbol corresponding to each codeword in the symbol table.

3. Prefix Common Portion/Individual (Remainder) Portions

As already described, the variable-length codes have a property that the number of the codewords including similar bit sequences at heads thereof increases as word lengths of the codewords get longer. By dividing the prefix 10 into the common portion 12 and the individual portions 13 as shown in FIG. 1B, making use of this property, the size of information that identifies the prefix can be reduced.

The prefix common portion 12 is the bit sequence common to the plurality of prefixes. As is clear from Table 2, four bits on the left side of all the prefixes are the same. Actually, five bits on the left side of five prefixes in Table 2 are the same. However, when the five bits on the left side are used as the common portion, no individual portion for a codeword "0101 0" is left. Thus, the four bits on the left side of the prefixes are used as the common portion. As described above, the four bits "0101" on the left side common to the five prefixes in Table 2 are defined as the common portion 12. A result where the prefixes in Table 2 are classified into the common portion 12 and the individual portions 13, and arranged as prefix information is shown in Table 3.

TABLE 3

Correspondence Table among Codewords, Prefix Common Portion, and Prefix Individual Portions

| codeword | prefix | prefix length [bits] plen[i] | suffix length [bits] slen[i] | prefix common portion prefix_common | prefix common portion length [bits] clen | prefix individual portion prefix_part[i] | prefix individual portion word length [bits] plen[i] |
|---|---|---|---|---|---|---|---|
| 0101 0 | 0101 0 | 5 | 0 | 0101 | 4 | 0 | 1 |
| 0101 010<br>0101 011 | 0101 01 | 6 | 1 | | | 01 | 2 |
| 0101 0010<br>0101 0011 | 0101 001 | 7 | 1 | | | 001 | 3 |
| 0101 0001 1 | 0101 0001 1 | 9 | 0 | | | 0001 1 | 5 |
| 0101 0001 00<br>0101 0001 01 | 0101 0001 0 | 9 | 1 | | | 0001 0 | 5 |

As will be described later, a codeword of variable-length code is decoded from an input bit sequence including an unknown codeword, using this prefix related information shown in Table 3. The prefix related information used in the decoding method in an exemplary embodiment of the present invention comprises items (1) to (5) that will be listed next. Item (6) is an input bit sequence to be decoded. In an example in Table 3, n is eight.

(1) prefix_common: a bit sequence (common portion) common to a plurality of prefixes (2) clen: a common portion word length (3) prefix_part[i]: bit sequences (individual portions) of the respective prefixes except the common portion, where i=0, 1, ... n−1

(4) plen[i]: word lengths of the respective individual portions, where i=0, 1, ... n−1

(5) slen[i]: word lengths of remaining bit sequences (suffixes) obtained by removing the prefixes from codewords, where i=0, 1, ... n−1

(6) input_bits: an input bit sequence including unknown codewords

4. Configuration of Decoding Device

Figure 2:
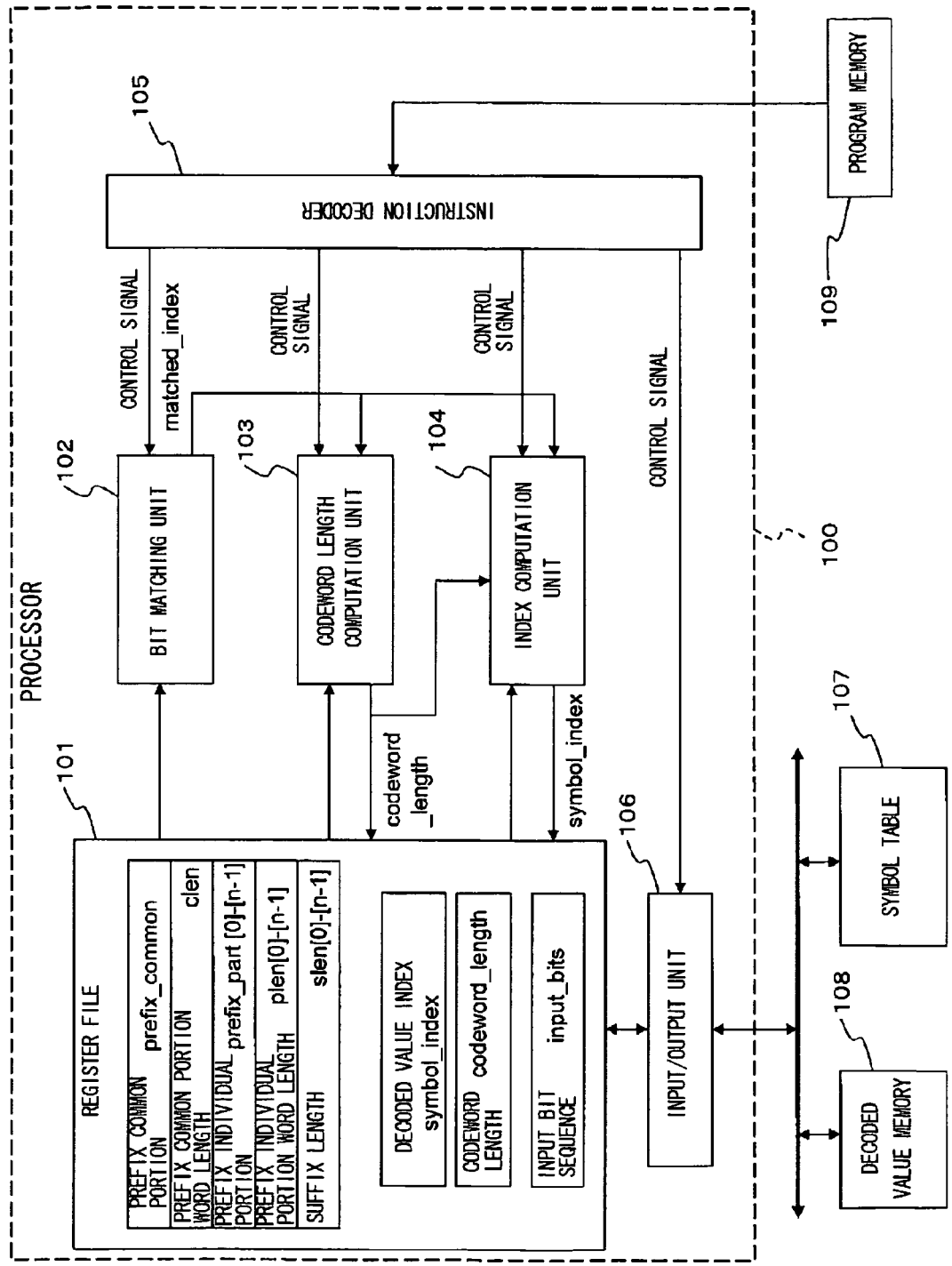
FIG. 2 is a functional block diagram showing variable-length code decoding device according to an exemplary embodiment of the present invention.

FIG. 2 is a functional block diagram showing variable-length code decoding device according to an exemplary embodiment of the present invention. The decoding device in this exemplary embodiment may be implemented by a program control processor 100. Using a register file 101 in the processor 100, a decoded value index symbol_index can be computed at high speed by a bit matching unit 102, a codeword length computation unit 103, and an index computation unit 104. The bit matching unit 102, codeword length computation unit 103, and index computation unit 104 are controlled by control signals from an instruction decoder 105. The processor 100 receives the prefix related information and the input bit sequence to be stored in the register file 101 through an input/output unit 106 according to a control signal from the instruction decoder 105. A configuration example of the decoding device in this exemplary embodiment is as follows.

The register file 101 includes 16 64-bit registers, and stores the prefix related information and the input bit sequence necessary for decoding the codeword of the variable-length code, that is:

(1) prefix_common: bit sequence (common portion) common to the prefixes (2) clen: common portion word length (3) prefix_part[i]: bit sequences (individual portions) of the respective prefixes except the common portion, where i=0, 1, ... n−1

(4) plen[i]: word lengths of the respective individual portions, where i=0, 1, ... n−1

(5) slen[i]: word lengths of the remaining bit sequences (suffixes) obtained by removing the prefixes from the codewords, where i=0, 1, ... n−1

(6) input_bits: input bit sequence including the unknown codeword.

The bit matching unit 102 receives the four prefix related information (1) to (4) described above and the input bit sequence (6) from the register file 101 and generates prefixes using the prefix related information (1) to (4). The bit matching unit 102 searches for a prefix that matches the input bit sequence (6) from the generated prefixes. Then, the bit matching unit 102 outputs a number matched_index of the prefix that has matched the input bit sequence (6) to the codeword length computation unit 103 and the index computation unit 104.

The codeword length computation unit 103 receives each common portion word length clen of the prefix related information (2), word lengths plen[i] of the respective individual portions of the prefix related information (4), and suffix word lengths slen[i] of the prefix related information (5). Then, using the number matched_index of the prefix that has matched the input bit sequence (6) output from the bit matching unit 102, the codeword length computation unit 103 computes a word length codeword_length of the codeword. The codeword length codeword_length, which is the result of the computation, is stored in the register file 101.

The index computation unit 104 receives the suffix codeword lengths slen[i] of the prefix related information (5) from the register file 101, and computes the decoded value index symbol_index, using the number matched_index of the prefix that has matched the input bit sequence (6) output from the bit matching unit 102, and stores the decoded value index symbol_index in the register file 101. The decoded value index symbol_index indicates the position (index) of a symbol (decoded value of the codeword) in a symbol table 107 that stores therein the symbol corresponding to the codeword. Accordingly, according to a control signal from the instruction decoder 105, the index computation unit 104 can refer to the symbol table 107 using the decoded value index symbol_index, and can store the decoded value obtained from the symbol table 107 in a decoded value memory 108.

The instruction decoder 105 decodes instructions read out from a program memory 109. Specifically, the instruction decoder 105 causes the bit matching unit 102, codeword length computation unit 103, and index computation unit 104 to operate, in response to the instruction for decoding the variable-length code, read out from the program memory 109. Then, the instruction decoder 105 stores in the register file 101 the word length codeword_length of the codeword, which is the result of the computation by the codeword length computation unit 103, and the decoded value index symbol_index, which is the result of computation by the index computation unit 104.

In the variable-length code decoding device according to this exemplary embodiment, the bit matching unit 102, codeword length computation unit 103, index computation unit 104, instruction decoder 105, and input/output unit 106 may be each formed of a functional circuit. Alternatively, by executing a decoding program on the processor, processes having the same functions may be implemented. Accordingly, the block diagram of FIG. 2 should be understood as functional expressions.

5. Operation

According to the present invention, an unknown codeword is decoded using the prefix. Decoding of the codeword begins from decoding a bit matching instruction in the instruction decoder 105. (When the instruction decoder 105 decodes the bit matching instruction,) it controls operations of the bit matching unit 102, codeword length computation unit 103, and index computation unit 104. Specifically, when the instruction decoder 105 decodes the bit matching instruction, operands specified by the bit matching instruction are used to operate the bit matching unit 102, codeword length computation unit 103, and index computation unit 104.

In order to perform such decoding of the (unknown) codeword, it is necessary to store the prefix related information and the input bit sequence in the register file 101 (before executing the bit matching instruction). Storage of the prefix related information and a decoding operation using the prefix related information will be described in detail.

5.1) Storage of Prefix Related Information

First, an example of the information to be stored in the register file 101 is as follows.

(1) prefix_common: bit sequence (common portion) common to the prefixes (of a 24-bit integer with no code)

(2) clen: common portion word length (of an 8-bit integer with no code)

(3) prefix_part[i]: bit sequences (individual portions) of the respective prefixes except the common portion (of 8-bit integers with no code), where i=0, 1, . . . 7

(4) plen[i]: word lengths of the respective individual portions (of 4-bit integers with no code), where i=0, 1, . . . 7

(5) slen[i]: word lengths of the remaining bit sequences (suffixes) (of 4-bit integers with no code) obtained by removing the prefixes from the codewords, where i=0, 1, . . . 7

(6) input_bits: input bit sequence (a 32-bit integer with no code) including an unknown codeword.

FIG. 3 is a schematic diagram showing a state where the prefix related information and the input bit sequence are stored in the register file 101 used in the decoding device of FIG. 2. Herein, the prefix related information and the input bit sequence are stored in five 64-bit registers Xs, Xp, Xc, Xd, and Xi in the register file 101, and one 64-bit register Xn (not shown) is used for storing an extracted decoded value.

Specifically, as shown in FIG. 3, the prefix common portion prefix_common and the prefix common portion word length clen are stored in the register Xc. The prefix individual portions prefix_part[i] (where i=0, 1, . . . 7) are stored in the register Xp. The prefix individual portion word lengths plen[i] and the suffix word lengths slen[i] (where i=0, 1, . . . 7) are stored in the register Xs. The input bit sequence input_bits is stored in the register Xi. Since the prefix individual portions are 8-byte long and each register is 64-bit long, eight prefix individual portions can be stored in one register. The word of 0b used in FIG. 3 indicates a binary number, and the character x indicates an unused bit. The actual value of x is zero (0).

According to Table 3, there are the five prefix related information. Table 4 shows respective values of the prefix individual portions prefix_part[i], prefix individual portion word lengths plen[i], and suffix word lengths slen[i]. In order to indicate that the three prefix_part[5], prefix_part[6], and prefix_part[7] are not definitely present, the corresponding prefix individual portion word lengths plen and the corresponding suffix word lengths slen are set to zero (in Table 4).

TABLE 4

Corresponding Table between Prefix Numbers and Prefix Individual Portions/Suffix Word Lengths

| number i | prefix individual portion prefix_part[i] | prefix individual portion word length [bits] plen[i] | suffix word length[bits] slen[i] |
|---|---|---|---|
| 0 | 0xxx xxxx | 1 | 0 |
| 1 | 01xx xxxx | 2 | 1 |
| 2 | 001x xxxx | 3 | 1 |
| 3 | 0001 1xxx | 5 | 0 |
| 4 | 0001 0xxx | 5 | 1 |
| 5 | xxxx xxxx | 0 | 0 |
| 6 | xxxx xxxx | 0 | 0 |
| 7 | xxxx xxxx | 0 | 0 |

☐ x indicates a bit not included in the prefix individual portion. The actual value of x is zero.

5.2) Bit Matching Instruction

The instruction decoder 105 decodes the bit matching instruction, and causes the bit matching unit 102, codeword length computation unit 103, and index computation unit 104 to operate, using operands specified in the bit matching instruction. The operation of the bit matching instruction will be shown below.

a1) The bit matching unit 102, codeword length computation unit 103, and index computation unit 104 receive contents of the 64-bit registers Xs, Xp, Xc, Xd, and Xi from the register file 101. Information on the prefixes and the suffixes is stored in the registers Xs, Xp, and Xc, as shown in FIG. 3. The input bit sequence including the unknown codeword is stored in the register Xi. The initial value of the index corresponding to the unknown codeword is stored on a higher order side (32-bit portion) of the register Xd.

a2) The bit matching unit 102 generates eight prefixes, using the prefix common portion prefix_common, prefix common portion word length clen, prefix individual portions prefix_part[i], and prefix individual portion word lengths plen[i](where i=0, 1, . . . 7) (details of which will be described later. Refer to FIG. 3).

a3) Further, the bit matching unit 102 matches the eight prefixes with the input bit sequence, and outputs to the codeword length computation unit 103 and the index computation unit 104 the number matched_index of the prefix which has matched the input bit sequence.

a4) The codeword length computation unit 103 computes the codeword length codeword_length of the unknown codeword, using the number matched_index of the prefix which has matched the input bit sequence, the word length clen of the prefix common portion prefix_common, the prefix individual portion word lengths plen[i], and the suffix word lengths slen [i], and assigns the computed codeword length codeword_length of the unknown codeword to a low-order side (lower 8-bit portion) of the 64-bit register Xd.

a5) The index computation unit 104 computes the decoded value index symbol_index in the symbol table 107, using the number matched_index of the prefix that has matched the input bit sequence, suffix word lengths slen[i], and unknown codeword word length codeword_length, and then assigns the computed index symbol_index to a high-order side (higher 32-bit portion) of the 64-bit register Xd.

By using this bit matching instruction, the position (index) symbol_index of the decoded value of the unknown codeword in the symbol table 107 and the word length codeword_length of the unknown codeword are obtained. Accordingly, after execution of the bit matching instruction, the decoded value can be retrieved from the symbol table 107, using the index symbol_index. Then, a portion of the input bit sequence corresponding to the currently decoded codeword from the input bit sequence input_bit stored in the register Xi, and to replenish the register Xi with a new bit sequence.

By repeating processing as described above, referring to the symbol table 107 obtained decoded values can be stored into the decoded value memory 108 one after another, while taking (segmenting) out unknown codewords one after another from the input bit sequence input_bits stored in the register Xi.

Prefix generation and matching processing by the bit matching unit 102, unknown codeword word length computation by the codeword length computation unit 103, and symbol index computation by the index computation unit 104 will be respectively described below in detail.

5.3) Prefix Generation

Figure 4:
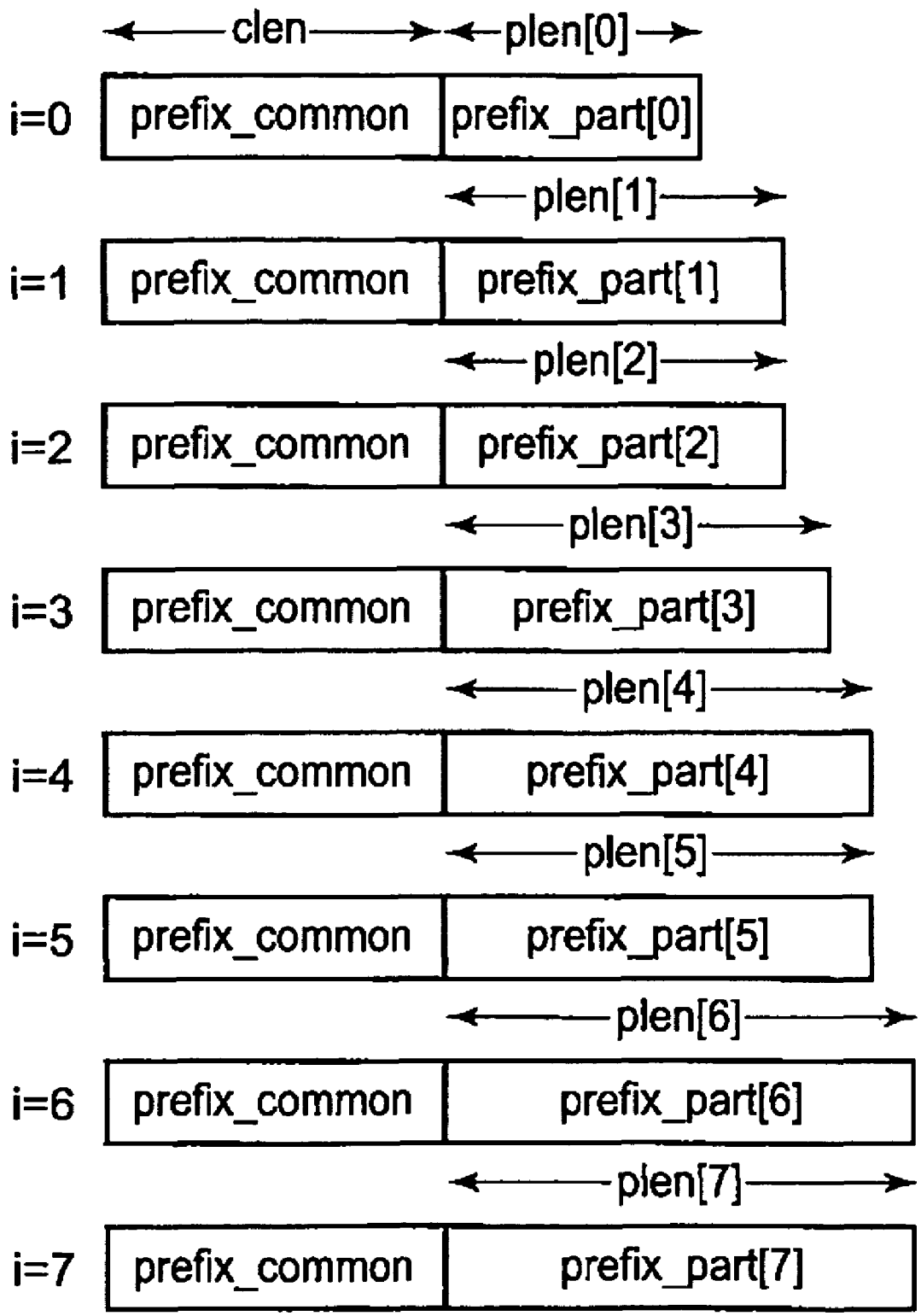
FIG. 4 is a schematic diagram showing eight prefixes generated by a bit matching unit 102.

FIG. 4 is a schematic diagram showing eight prefixes generated by the bit matching unit 102. A procedure for generating a prefix from the prefix common portion and a prefix individual portion by the bit matching unit 102 will be exemplified below.

b1) First, the bit matching unit 102 extracts the prefix common portion prefix_common (of 24 bits) and the word length clen (of eight bits) of the prefix common portion from the register Xc.

b2) The bit matching unit 102 extracts bits sequence of the clen from the left side of the prefix common portion prefix_common, and sets the extracted bits sequence to the prefix common portion prefix_common again.

b3) The bit matching unit 102 extracts the prefix individual portions prefix_part[i], where i=0, 1, . . . 7 and each of which is composed of eight bits, from the register Xp.

b4) The bit matching unit 102 respectively extracts bits sequence of the plen[i] from the left side of the respective prefix individual portions prefix_part[i], where i=0, 1, . . . 7, and sets the extracted bits sequences to the prefix individual portions prefix_part[i] again.

b5) The bit matching unit 102 respectively connects the prefix common portion prefix_common having a length of clen bits to the left side of the prefix individual portions prefix_part[i] having a length of plen[i] bits, where i=0, 1, . . . 7.

By the steps b1) to b5) described above, the bit matching unit 102 generates the eight prefixes (prefix_common+prefix_part[i]) shown in FIG. 4.

5.4) Matching

The bit matching unit 102 matches the generated eight prefixes with the head portion of the input bit sequence input_bits and checks which prefix matches the input bit sequence. A procedure for matching will be shown below.

c1) The bit matching unit 102 extracts the (clen+plen[i]) bits (where i=0, 1, . . . 7) from the left side of the input bit sequence, for each prefix.

c2) The bit matching unit 102 obtains an exclusive logical sum (XOR) of the extracted (clen+plen[i]) bits and the i-th prefix, and determines from a result of the XOR operation whether the extracted (clen+plen[i]) bits and the i-th prefix match or not. Herein, when the result of the XOR operation is "0 (zero)", the bit matching unit 102 determines that the i-th prefix matches the input bits.

c3) When the prefix that has matched the input bit sequence is present, the bit matching unit 102 assigns the number "i" of the prefix which has matched the input bit sequence to the matched_index.

c4) When the prefix that has matched the input bit sequence is not present, the bit matching unit 102 assigns a numerical value outside a range (herein, i being an integer in a range from 0 to 7, so that the numerical value outside this range such as "8" corresponding to the numerical value outside the range) to the matched_index.

The number "i" of the prefix that has matched the input bit sequence is then output to the codeword length computation unit 103 and the index computation unit 104, as a matched_index.

5.5) Word Length of Codeword

The codeword length computation unit 103 computes a word length codeword_length of an unknown codeword included in the input bit sequence as follows, using the matched_index, which is the number of the prefix that has matched the input bit sequence and has been obtained from the bit matching unit 102.

d1) The codeword length computation unit 103 extracts a prefix individual portion word length plen[matched_index] and a suffix word length slen[matched_index] corresponding to the matched_index from the register Xs.

d2) The codeword length computation unit 103 extracts the word length clen of the prefix common portion from the register Xc.

d3) When the matched_index is less than 8 (or when the prefix that has matched the input bit sequence is present), the codeword length computation unit 103 computes the sum of the prefix common portion word length clen, prefix individual portion word length plen[matched_index] and suffix word length slen[matched_index], thereby obtaining a word length codeword_length of the unknown codeword. When the matched_index is 8 or higher, it means that the prefix that has matched the input bit sequence is not present. Thus, the codeword length computation unit 103 assigns "0(zero)" to the codeword_length.

The codeword_length of the unknown codeword thus obtained is stored in the register file 101, and is also output to the index computation unit 104.

5.6) Decoded Value Index Computation

As described above, decoded values for the codewords as shown in Table 1, for example, are stored in the symbol table 107. A position of the symbol table 107 where a decoded value is stored is identified by the index symbol_index. The index computation unit 104 obtains the decoded value index symbol_index as follows.

Figure 5:
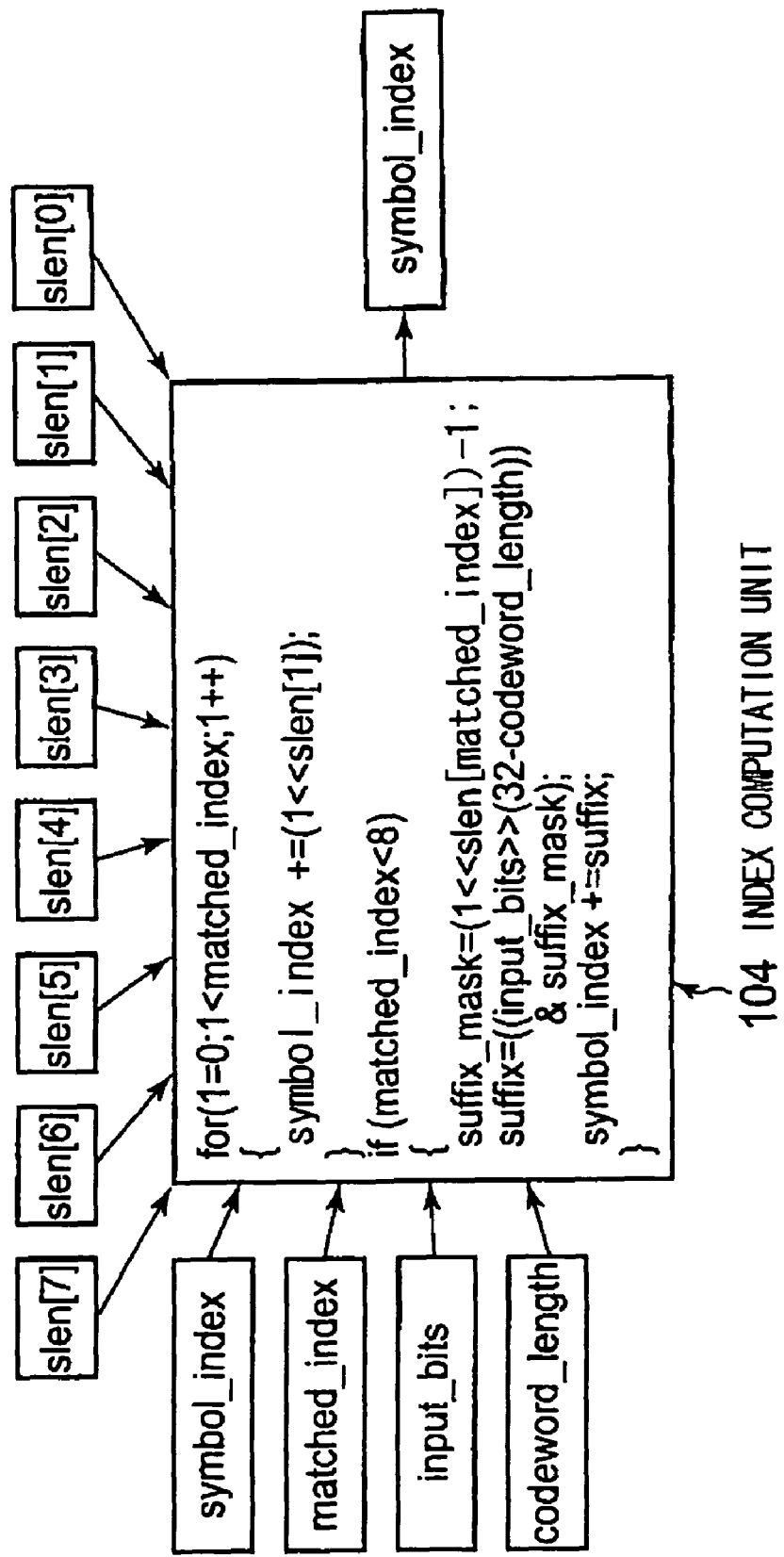
FIG. 5 is an explanatory diagram showing a procedure for obtaining a decoded value index symbol_index.

FIG. 5 is an explanatory diagram showing a procedure for obtaining the index symbol_index of the decoded value. Herein, the matched_index indicates the number of the prefix that has matched the input bit sequence, and the codeword_length indicates the word length of the unknown codeword included in the input bit sequence.

e1) The index computation unit 104 extracts the initial value of the index symbol_index from the register Xd.

e2) The index computation unit 104 extracts the slen[i] of the suffixes, where i=0, 1, . . . 7, from the register Xs.

e3) The index computation unit 104 adds, to the symbol_index, value(s) (of 1<<slen[i]) obtained by shifting "1" to the left by slen[i] bits, where i=0, 1, . . . (matched_index−1), respectively. That is, the values of (1<<slen[0]), (1<<slen [1]), . . . and (1<<slen[matched_index-1]) are added to the symbol_index one after another.

e4) When the matched_index is less than 8 (i.e. when a matching prefix is present), the index computation unit 104 extracts a bit sequence corresponding to the suffix from the input bit sequence, and adds the bit sequence to the symbol_index. Bits of the codeword_length on the left side of the input bit sequence is the unknown codeword, while the bits of the slen[matched_index] on the right side of the unknown codeword is the suffix.

5.7) Decoding of Variable-length Code

A procedure for decoding variable-length code, using the bit matching instruction described in the above-mentioned paragraph 5.2) will be explained, with reference to a drawing.

Figure 6:
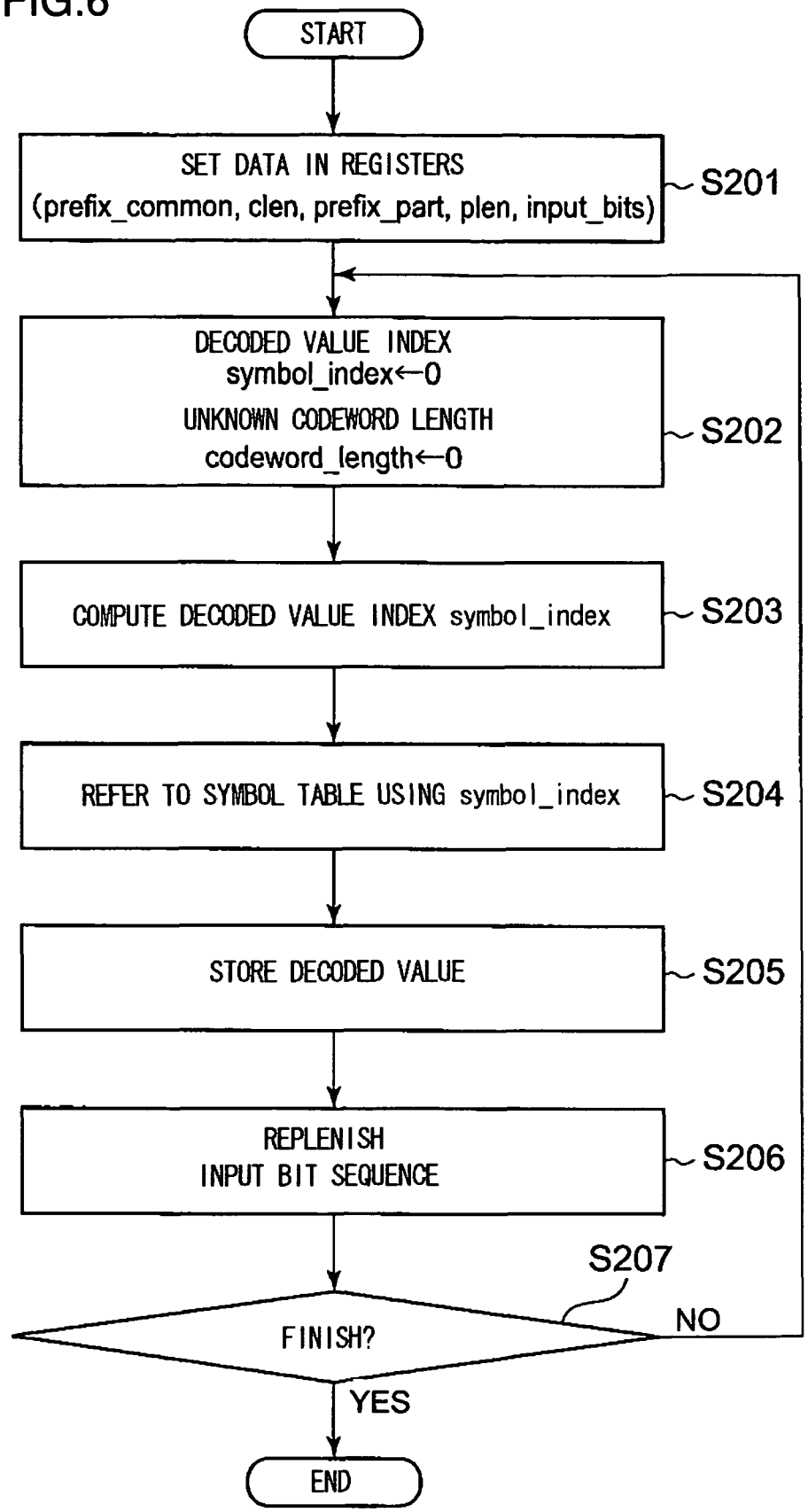
FIG. 6 is a flowchart showing a decoding method in an exemplary embodiment of the present invention.

FIG. 6 is a flowchart showing the decoding method according to an embodiment of the present invention. The processor 100 shown in FIG. 1 [sic.2] executes a program designed so that the processor 100 can work according to this flow. Herein, the procedure for decoding, using the register file 101 shown in FIG. 3, will be explained.

Step S201: First, data necessary for decoding processing is set in the following registers. The prefix common portion prefix_common is placed at a part (low-order side) of the register Xc (in 31st to 8th bit positions of the register Xc). The prefix common portion word length clen is placed at the lower 8-bit portion of the register Xc (in 7th to 0th bit positions of the register Xc). The eight prefix individual portions prefix_part[i](where i=0, 1, . . . 7) are placed at the register Xp (in 63rd to 0th bit positions of the register Xp). The prefix individual portion word lengths plen[i](where i=0, 1, . . . 7) are placed at the higher order side (32-bit portion) of the register Xs (in 63rd to 32nd bit positions of the register Xs). The suffix word lengths slen[i] (where i=0, 1, . . . 7) are placed at the lower order side (32-bit portion) of the register Xs (in 31st to 0th bit positions of the register Xs). The input bit sequence input_bits is placed at the higher 32-bit portion the register Xi (in 63rd to 32nd bit positions of the register Xi).

Step S202: Then, as an initial value of the decoded value index symbol_index, "0" (zero) is assigned. As an initial value of the word length codeword_length of the unknown codeword, "0" is assigned. As shown in FIG. 3, the index symbol_index is placed at the higher 32-bit portion of the register Xd (in, 63rd to 32nd bit positions of the register Xd), and the word length codeword_length of the unknown codeword is placed at the lower 8-bit portion of the register Xd (in 7th to 0th bit positions of the register Xd). In other words, the register Xd is initialized to "0".

Step S203: Using the bit matching instruction, matching between the eight prefixes and the input bit sequence is performed. As described above, according to the bit matching instruction, the eight prefixes are generated from the registers Xc, Xp, and Xs, and the prefix that matches the input bit sequence in the register Xi is searched. Further, the word length codeword_length of the unknown codeword of the input bit sequence is computed, and then the index symbol_index indicating the position of the decoded value in the symbol table 107 is computed. The index symbol_index is stored into the higher 32-bit portion of the register Xd (in the 63rd to 32nd bit positions of the register Xd). If the prefix that matches the known codeword is present, the word length codeword_length of the unknown codeword is stored into the lower 8-bit portion of the register Xd (in the 7th to 0th bit positions of the register Xd).

Step S204: Then, using the index symbol_index computed according to the bit matching instruction, the symbol table 107 is referred to, and the decoded value is then retrieved. The decoded value is stored into the lower 32-bit portion of a register Xn (not shown) (in 31st to 0th bit positions of the register Xn).

Step S205: The decoded value stored in the register Xn is transferred to the decoded value memory 108 through the input/output unit 106, and stored in the decoded value memory 108.

Step S206: When the word length codeword_length of the unknown codeword is larger than zero, the decoded codeword is removed from the input bit sequence in the register Xi, and a new input bit sequence is replenished (entered).

Step S207: When the decoded value indicates completion of decoding processing (YES in step S207), the decoding processing is finished. When the word length codeword_length of the unknown codeword is not more than "0" (zero), it means that the codeword has not been decoded. In this case, the decoding processing is stopped. When a(n) (input) bit sequence to be decoded is present (No in step S207), the operation is returned to step S202, and then the steps S202 to S207 are repeated until the decoding processing is finished. Input bit sequences are thereby decoded one after another.

6. Application Example/Variant Example

The elements of the processor 100 shown in FIG. 1 may be variously applied in a range without departing from the content already explained. A specific application example or a variation example will be described below.

6.1) In the exemplary embodiment described above, the eight prefixes were exemplified. Generally, the number of prefixes corresponding to codewords is larger than eight. When codewords having the eight prefixes or more are decoded, a method where the prefixes are classified for every eight prefixes and matched with an unknown codeword may be used. When the number of the prefixes is 23 in step S203 in FIG. 6, for example, the prefixes are classified into eight, eight, and seven prefixes, and the matching is performed. That is, by executing the above-mentioned bit matching instruction three times, the 23 prefixes can be matched with the unknown codeword. By exercising such control, similar processing can be performed even if an arbitrary number of prefixes is used.

6.2) On the contrary, when codewords having the comparatively small number of prefixes are decoded, the codeword(s) per se may be employed and may also be matched with an unknown codeword without using the prefixes. When the matching is performed using the codeword(s) per se, the word length of the suffixes is regarded as zero, and the bit matching instruction can be used. Generally, however, use of prefixes reduces the number of times for matching more.

6.3) The maximum word length of the prefix of a codeword may be 8 bits or less. When the codeword is decoded using such a prefix, the word length of the prefix common portion is regarded as zero, and the bit matching instruction can be used. Since the word length of the prefix common portion is regarded as zero, processing of storing the prefix common portion in the register file 101 may be omitted.

6.4) In the exemplary embodiments described above, the eight prefixes are matched at a time with the unknown codeword according to the bit matching instruction. When the number of the prefixes for which the matching is performed at one time is increased, the number of times of executing the bit matching instruction can be reduced. On the other hand, when the number of the prefixes for which the matching is performed at one time is reduced, the circuit size can be reduced, thereby leading to a higher-speed operation and lower power consumption. Accordingly, the number of prefixes for which matching is performed at one time may be changed, according to the request of a user.

6.5) In the exemplary embodiments described above, the register file 101 of the processor 100 has 16 64-bit registers. However, as already described, this configuration is one example, and may be changed in accordance with the operation of the bit matching instruction. A configuration including 128 8-bit registers, 64 16-bit registers, 32 32-bit registers, for example, may be conceived.

6.6) In the exemplary embodiments described above, as shown in FIG. 3, the information necessary for decoding a codeword (such as the prefix related information, suffix word lengths, and input bit sequence) is stored in the register file 101. This method to store the information is one example, too, and may be changed in accordance with the operation of the bit matching instruction. In which registers of the register file 101 these information be stored, in which positions of the registers these information be stored, how many bits be set as the size of each information, and the like may be changed.

In the present invention, the following modes are possible.

<Mode 1>

There is provided a variable-length code decoding method of decoding variable-length encoded codeword using prefix included in the codeword, comprising:

storing in storage means a prefix common portion common to a plurality of prefixes used for decoding and a word length of the prefix common portion, a prefix individual portion except the prefix common portion in each prefix and a word length of the prefix individual portion, a word length of a suffix except the prefix in each of a plurality of codewords, and an input bit sequence including an unknown codeword of variable-length code;

determining which prefix among a plurality of prefixes is included or not in the input bit sequence, said plurality of prefixes being generated from the prefix common portion and a plurality of prefix individual portions;

computing a word length of the unknown codeword included in the input bit sequence, using the word length of the prefix common portion, the word length of the prefix individual portion, and the word length of the suffix, specified based on a result of the determination;

computing an index for a decoding table, using the word length of the suffix and the word length of the unknown codeword specified based on the result of the determination; and retrieving a decoded value by referring to said decoding table, using the index.

<Mode 2>

There is provided a variable-length code decoding method of decoding variable-length encoded codeword using a decoded value table, comprising:

storing a plurality of codewords used for decoding and word lengths of the codewords, and an input bit sequence including an unknown codeword of variable-length code;

determining which codeword among the codewords is included or not in the input bit sequence, using the codewords and the word lengths of the codewords;

computing a word length of the unknown codeword included in the input bit sequence, based on a result of the determination;

computing an index for referring to said decoded value table, based on the result of the determination; and referring to said decoding table and retrieving a decoded value, using the index.

<Mode 3>

There is provided a variable-length code decoding program that causes a computer formulating a decoding device that decodes variable-length encoded codeword using a prefix included in the codeword to execute:

storing in storage means a prefix common portion common to a plurality of prefixes used for decoding and a word length of the prefix common portion, a prefix individual portion except the prefix common portion in each prefix and a word length of the prefix individual portion, a word length of a suffix except the prefix in each of a plurality of codewords, and an input bit sequence including an unknown codeword of variable-length code;

determining which prefix among a plurality of prefixes is included or not in the input bit sequence, said plurality of prefixes being generated from the prefix common portion and the prefix individual portions;

computing a word length of the unknown codeword included in the input bit sequence, using the word length of the prefix common portion, the word length of the prefix individual portion, and the word length of the suffix, specified based on a result of the determination;

computing an index for a decoding table, using the word length of the suffix and the word length of the unknown codeword, specified based on the result of said determining; and retrieving a decoded value by referring to said decoded value table, using the index.

<Mode 4>

There is provided a variable-length code decoding program that causes a computer formulating a decoding device that decodes variable-length encoded codeword using a decoded value table, to execute:

storing a plurality of codewords used for decoding and word lengths of the codewords, and an input bit sequence including an unknown codeword of variable-length code;

determining which codeword among said plurality of codewords is included or not in the input bit sequence, using said plurality of codewords and the word lengths of the codewords;

computing a word length of the unknown codeword included in the input bit sequence, based on a result of said determining;

computing index for referring to said decoded value table, based on the result of said determining; and retrieving a decoded value by referring to said decoding table and, using the index.

INDUSTRIAL APPLICABILITY

The present invention can be applied to a device that decodes information in general encoded by variable-length encoding. The invention can be applied to a decoder that decodes information on an image or music encoded using variable-length code, for example.

Alterations and adjustments of exemplary embodiments or examples are possible within the overall disclosure of the present invention (including claims) and based on a technical concept of the present invention. Various combinations or selections of various disclosed elements are possible within the scope of the claims of the present invention.

The invention claimed is:

1. A variable-length code decoding device that decodes variable-length encoded codeword using prefix included in the codeword, comprising:

a unit that stores a prefix common portion common to a plurality of prefixes used for decoding, a prefix individual portion except the prefix common portion in each prefix, and an input bit sequence including an unknown codeword of variable-length code; and a prefix identification unit that determines which prefix among a plurality of prefixes is included or not in the input bit sequence stored in said storage unit, said plurality of prefixes being generated from each prefix common portion and a plurality of prefix individual portions corresponding to the prefix common portion concerned, said prefix common portion and said prefix individual portions being stored in said storage unit.

2. A variable-length code decoding device that decodes variable-length encoded codeword using a prefix included in the codeword, comprising:

a storage unit that stores a prefix common portion common to a plurality of prefixes used for decoding and a word length of the prefix common portion, a prefix individual portion except the prefix common portion in each prefix and a word length of the prefix individual portion, a word length of a suffix except the prefix in each of a plurality of codewords, and an input bit sequence including an unknown codeword of variable-length code;

a prefix identification unit that determines which prefix among the prefixes generated from the prefix common portion and the plurality of prefix individual portions is included or not in the input bit sequence;

a word length computation unit that computes word length of the unknown codeword included in the input bit sequence, using the word length of the prefix common portion, the word length of the prefix individual portion, and the word length of the suffix, specified based on a result of the determination;

an index computation unit that computes index of a decoding table, using the word length of the suffix and the word length of the unknown codeword, specified based on the result of the determination; and a control unit that controls said prefix identification unit, said word length computation unit, and said index computation unit, according to an instruction for generating the word length of the unknown codeword included in the input bit sequence and the index for said decoding table.

3. A program control processor implementing said decoding device according to claim 2, wherein said storage unit comprises a register file; and said control unit comprises an instruction decoder that controls said prefix identification unit, said word length computation unit, and said index computation unit according to an instruction of a decoding program and stores in said register file the computed word length of the unknown codeword and the index of said decoding table.

4. A variable-length code decoding device that decodes variable-length encoded codeword using a decoded value table, comprising:

storage means for storing a plurality of codewords used for decoding and word lengths of the codewords, and an input bit sequence including an unknown codeword of variable-length code;

identification means for determining which codeword among the codewords is included or not in the input bit sequence, using the codewords and the word lengths of the codewords;

word length computation means for computing word length of the unknown codeword included in the input bit sequence, based on a result of the determination;

index computation means for computing index for referring to said decoded value table, based on the result of the determination; and control means for controlling said identification means, said word length computation means, and said index computation means such that the word length of the unknown codeword included in the input bit sequence and the index are generated.

5. A program control processor that implements said decoding device according to claim 4, wherein said storage means comprises a register file; and said control means comprises an instruction decoder that controls said identification means, said word length computation means, and said index computation means according to an instruction of a decoding program, and stores the computed word length of the unknown codeword and the computed index in said register file.

6. A variable-length code decoding method of decoding variable-length encoded codeword using a prefix included in the codeword, comprising:

storing a prefix common portion common to a plurality of prefixes used for decoding;

storing a prefix individual portion except the prefix common portion in each prefix;

storing an input bit sequence including an unknown codeword of variable-length code;

generating prefixes from each prefix common portion and a plurality of prefix individual portions corresponding to the prefix common portion concerned, said prefix common portion and said prefix individual portions being stored; and determining which prefix among said prefixes is included or not in the input bit sequence.

7. A variable-length code decoding program that causes a computer comprising a decoding device that decodes variable-length encoded codeword using a prefix included in the codeword to:

storing a prefix common portion common to a plurality of prefixes used for decoding;

storing a prefix individual portion except the prefix common portion in each prefix;

storing an input bit sequence including an unknown codeword of variable-length code;

generating a plurality of prefixes generated from each prefix common portion and a plurality of prefix individual portions corresponding to the prefix common portion concerned, said prefix common portion(s) and said prefix individual portions being stored; and determining which prefix among said plurality of prefixes is included or not in the input bit sequence.

* * * * *